United States Patent [19]

Barrow

[11] Patent Number: 5,650,660
[45] Date of Patent: Jul. 22, 1997

[54] CIRCUIT PATTERN FOR A BALL GRID ARRAY INTEGRATED CIRCUIT PACKAGE

[76] Inventor: Mike Barrow, 5000 Beechwood Ct., El Dorado Hills, Calif. 95762

[21] Appl. No.: 575,338

[22] Filed: Dec. 20, 1995

[51] Int. Cl.⁶ .................................................. H01L 21/60
[52] U.S. Cl. .............................. 257/668; 257/786
[58] Field of Search ...................... 257/668, 666, 257/670, 784, 786

[56] References Cited

U.S. PATENT DOCUMENTS 5,168,368  12/1992  Gow, III et al. ................. 257/668
5,468,999  11/1995  Lin et al. .......................... 257/780

*Primary Examiner*—Tom Thomas
*Assistant Examiner*—Roy Potter

[57] ABSTRACT

A substrate for a ball grid array (BGA) integrated circuit package. The top surface of the substrate has a center die paddle and a plurality of bonding fingers. The bonding fingers are arranged into four segments which each have a pattern that approximates a segment of a hyperbola. Located between the bonding fingers and the die paddle are a plurality of inner bond pads. The die paddle, bonding fingers and inner bond pads are all connected to external bond pads located on an opposite bottom surface of the substrate. The hyperbolic bonding finger pattern and additional inner bond pads increase the pin count and/or decrease the die size of the package.

11 Claims, 4 Drawing Sheets

CIRCUIT PATTERN FOR A BALL GRID ARRAY INTEGRATED CIRCUIT PACKAGE

BACKGROUND OF THE INVENTION

1. Field of the Invention

The present invention relates to a ball grid array integrated circuit package.

2. Description of Related Art

Integrated circuits (ICs) are typically located within a package that is mounted to an external printed circuit board. There has been developed a low profile IC package commonly referred to as a ball grid array (BGA). BGA packages typically contain a substrate that has a plurality of external bond pads located on a bottom surface. Individual solder balls are attached to the external pads of the substrate. The BGA package can be subsequently assembled to a printed circuit board by soldering the solder balls onto corresponding pads of the board. The BGA substrate typically contains internal vias and routing that couple the bond pads to an integrated circuit mounted to the top surface of the substrate.

FIG. 1 shows routing for the top surface of a prior art BGA substrate. The substrate has an inner die paddle 1 which is typically dedicated to electrical ground. Concentric with the die paddle 1 is a voltage bar 2 that is typically dedicated to the voltage source of the integrated circuit. Located around the die paddle and voltage bar are a plurality of bonding fingers 3. The bonding fingers 3 are typically dedicated to the input/output (I/O) signals of the integrated circuit. The bonding fingers 3 are routed to vias 4 that are connected to external bond pads (not shown) located on opposite side of the substrate. An integrated circuit is mounted to the center of the substrate and connected to the voltage bar 2 and bonding fingers 3 by a number of wire bonds (not shown).

The bonding fingers are arranged into four different segments which each have a slight radial pattern. Newly developed integrated circuits continually require additional I/O pins. Increasing the I/O of the package typically requires a larger radius for the radial pattern of bonding fingers. To maintain a minimum wire length of the wire bonds, the outer dimensions of the integrated circuit die must be increased to match the larger radius of the bonding finger pattern. The increase in die dimensions increase the overall size of the package. It would be desirable to increase the I/O of a BGA package while maintaining or even decreasing the size of the integrated circuit die.

SUMMARY OF THE INVENTION

The present invention is a substrate for a ball grid array (BGA) integrated circuit package. The top surface of the substrate has a center die paddle and a plurality of bonding fingers. The bonding fingers are arranged into four segments which each have a pattern that approximates a segment of a hyperbola. Located between the bonding fingers and the die paddle are a plurality of inner bond pads. The die paddle, bonding fingers and inner bond pads are all connected to external bond pads located on an opposite bottom surface of the substrate. The hyperbolic bonding finger pattern and additional inner bond pads increase the pin count and/or decrease the die size of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 2:
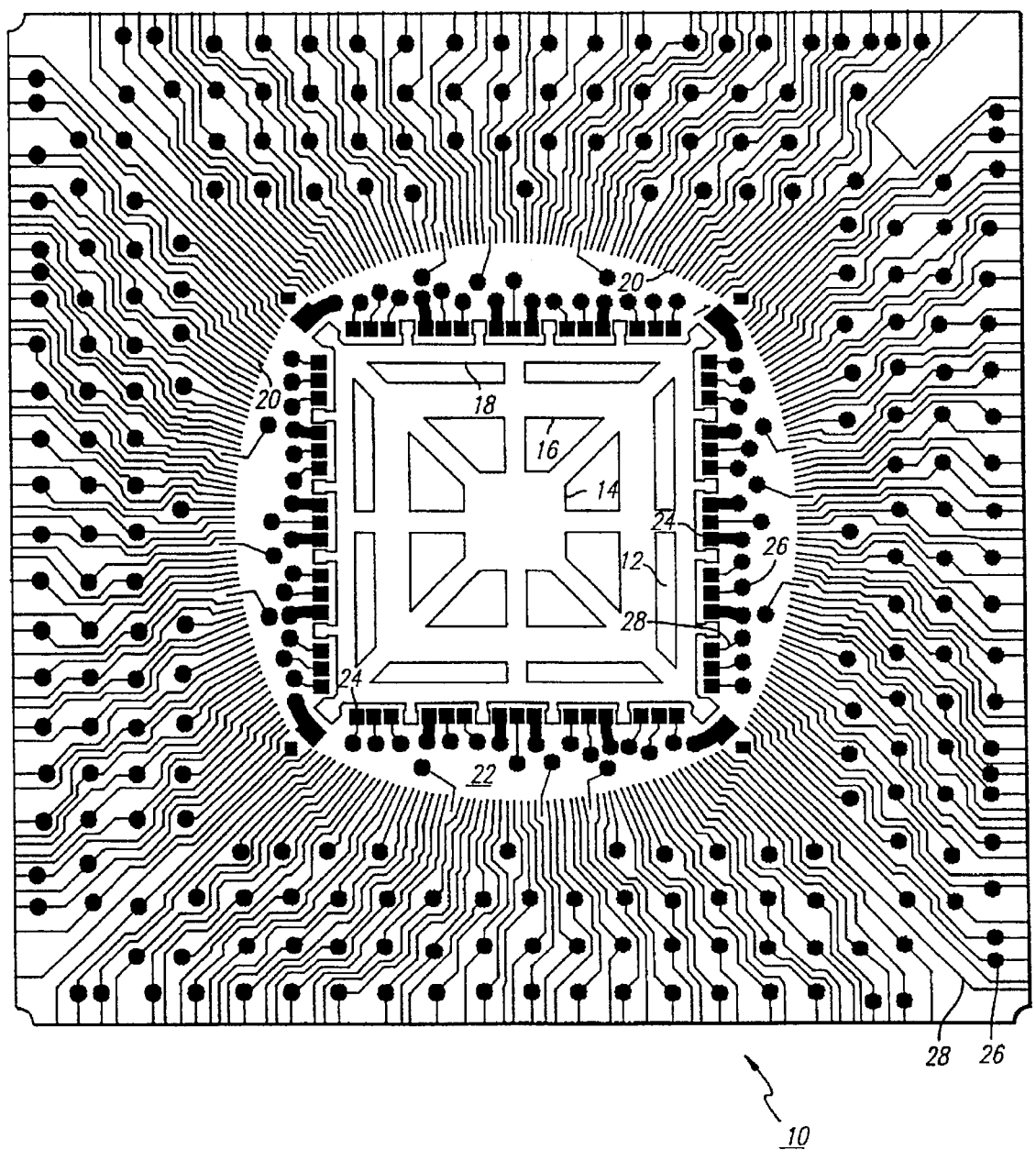
FIG. 2 is a top view of a substrate of the present invention.

Referring to the drawings more particularly by reference numbers, FIG. 2 shows a substrate 10 of the present invention. The substrate 10 is typically incorporated into a ball grid array (BGA) integrated circuit package. An integrated circuit (not shown in FIG. 2) is typically mounted and wire bonded to the substrate 10. The substrate 10 is preferably constructed using known printed circuit board processes, although it is to be understood that the substrate 10 can be formed with other techniques such as co-fired ceramic.

The substrate 10 has a center die paddle 12. The die paddle 12 preferably contains a center portion 14 and a pair of concentric rings 16 and 18. The die paddle 12 is typically dedicated to the ground pins of the integrated circuit. Located about the die paddle 12 are a plurality of bonding fingers 20. The bonding fingers 20 are arranged into four different segments. Each segment contains a finger pattern that corresponds to a segment of a hyperbola. In the preferred embodiment, the hyperbolic arc has a radius of curvature less than 1.200 inches. The hyperbolic finger patterns create four separate spaces 22 between the bonding fingers 20 and the die paddle 12. The spaces 22 provide area for a number of inner bond pads 24. The inner bond pads 24 and bonding fingers 20 are connected to vias 26 by routing traces 28. The spaces 22 also provide for the vias 26. The die paddle 12 also has a plurality of vias (not shown) located therein. In addition to providing electrical connection between the layout of the package, the vias 26 also provide a thermal path for the removal of heat generated by the integrated circuit.

Figure 1:
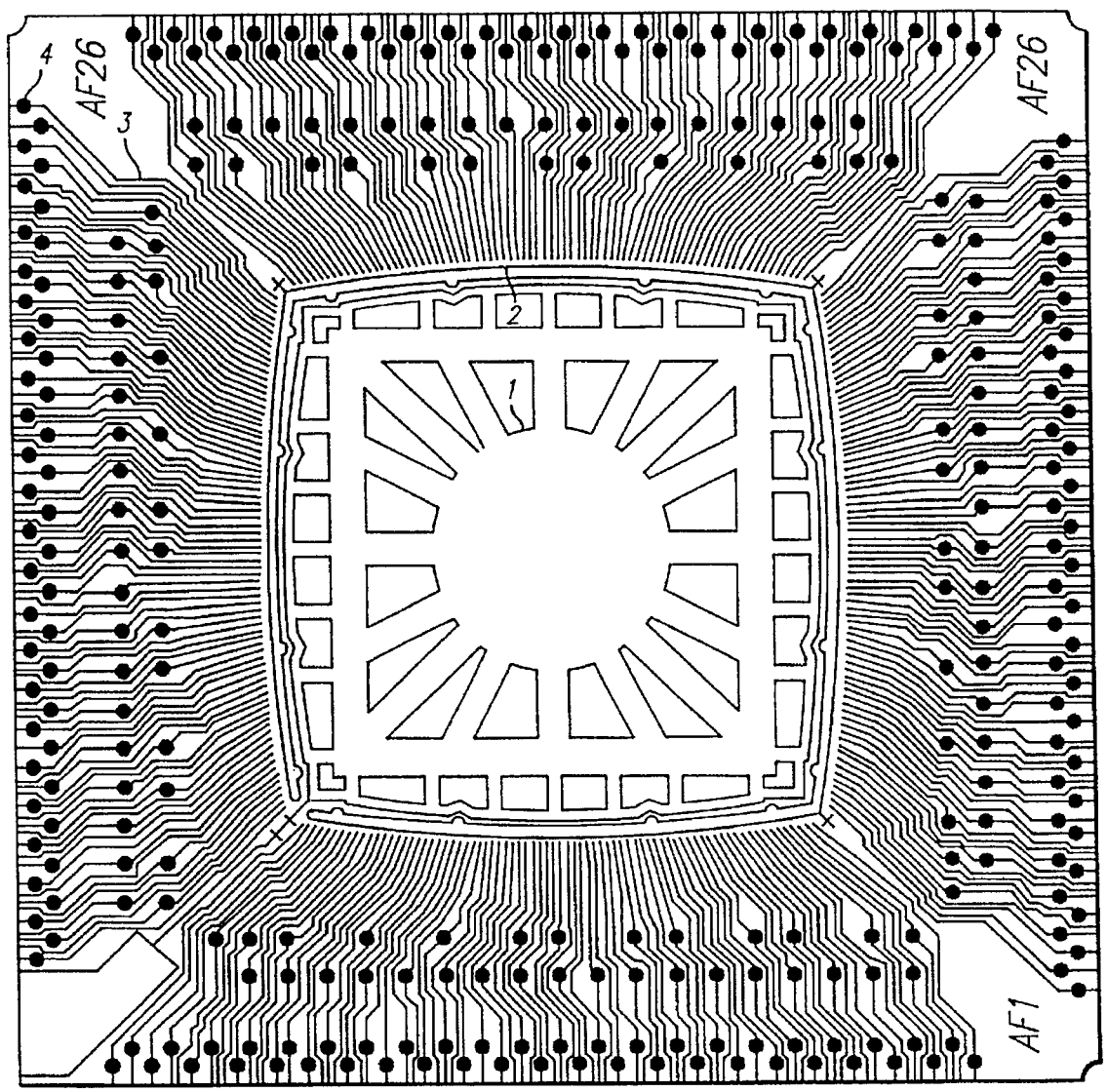
FIG. 1 is a top view of a ball grid array substrate of the prior art.

Arranging the bonding fingers 20 into a hyberbolic pattern provides space for the additional bonding pads 24 and vias 26. The additional bonding pads may increase the overall I/O of the substrate 10. By way of example, a 256 I/O pin count of a conventional BGA package may be increased to 320 without increasing the size of the package. Some of the additional bonding pads 24 may be dedicated to voltage and ground. Dedicating some of the pads to voltage/ground allows the voltage bar 2 shown in the prior art substrate of FIG. 1 to be eliminated, further providing additional space on the substrate 10.

The inclusion of the inner pads 24 may also reduce the number of bonding fingers 20, so that the distance between the integrated circuit and the outermost fingers 20 is reduced. The reduction in IC to finger length may decrease the outer dimensions of the integrated circuit and/or the length of the wire bonds. By way of example, the outer die dimensions of a conventional BGA package may be reduced in size by 150%. Additionally, the bonding finger 20 routing density may be relaxed by placing some of the finger vias within the spaces 22. The pad pattern of the present invention also provides a package that contains outer bond wires of the same length. Providing bond wires of the same length creates a spacing advantage that improves the molding process of the final package.

Figure 3:
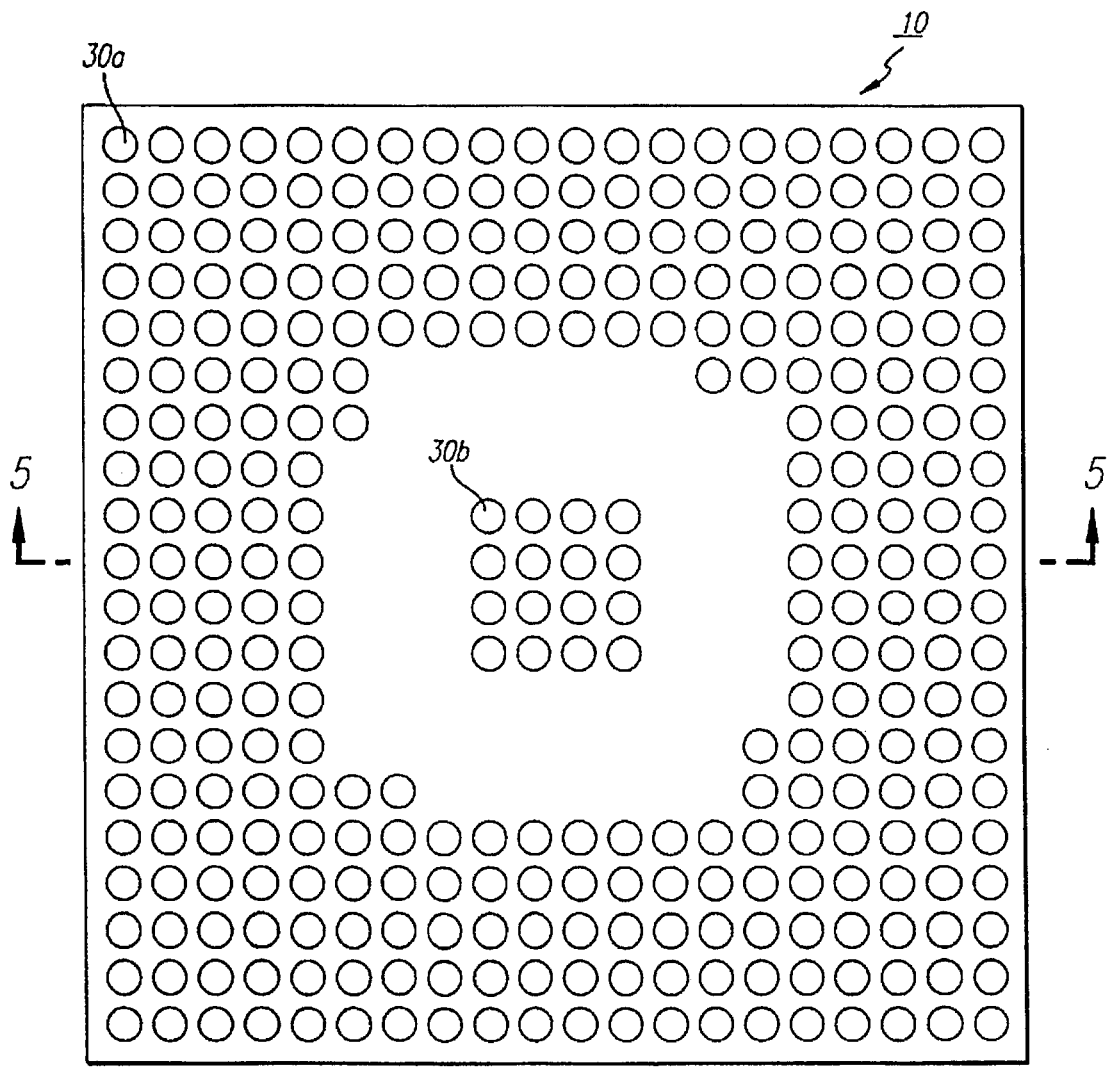
FIG. 3 is a bottom view of the substrate of FIG. 2.

As shown in FIG. 3, the opposite bottom surface of the printed circuit board 10 has a plurality of external solder pads 30 that are connected to the die paddle 12, bonding fingers 20 and inner bond pads 24 by the vias 26. The external solder pads 30 are preferably arranged into a matrix of outer pads 30a that are located about a number of center pads 30b. The outer pads 30a preferably have five rows for each side of the matrix. The additional rows of pads 30a increase the pin density of the package.

Figure 4:
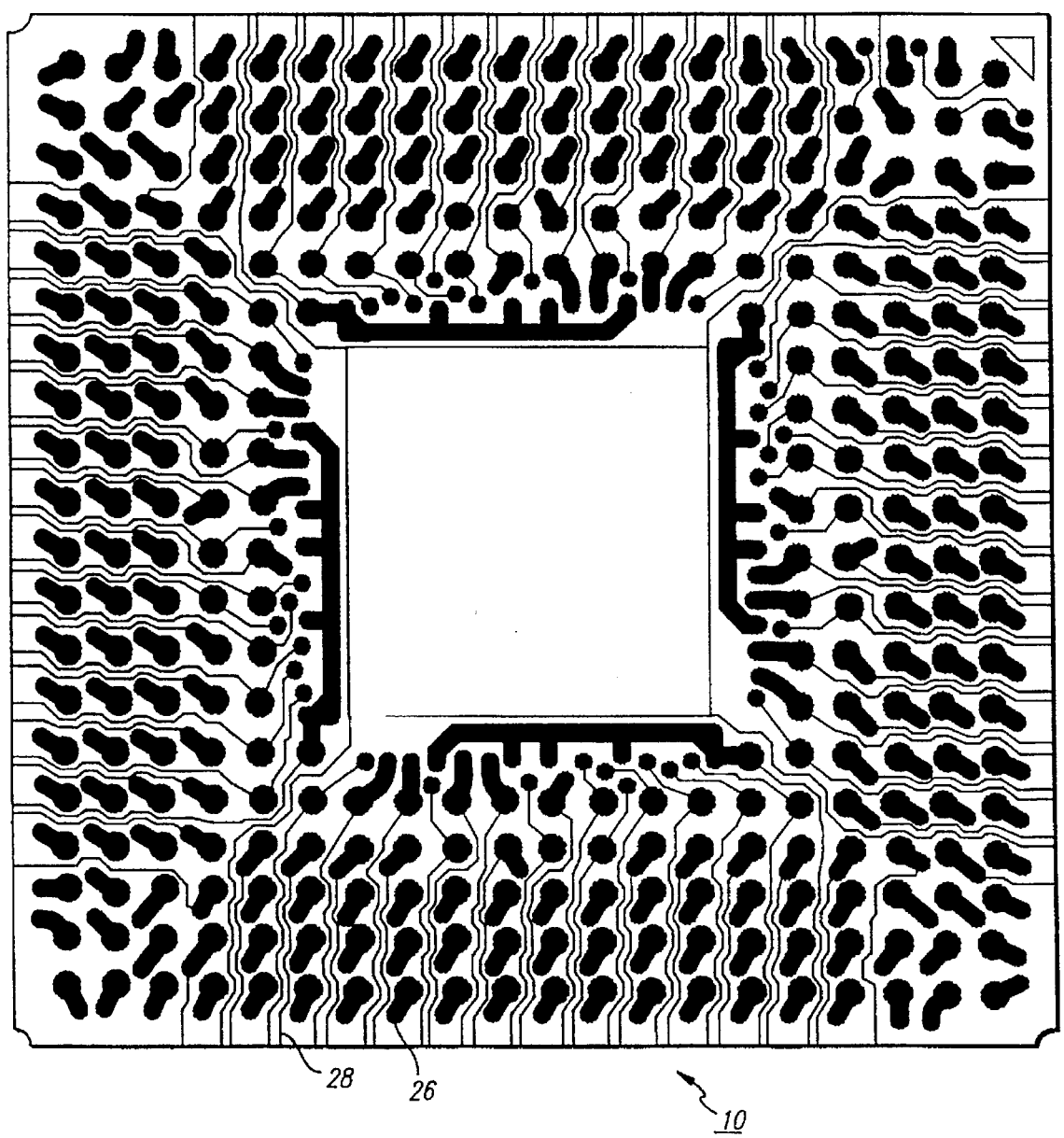
FIG. 4 is a cross-sectional view showing internal routing of the substrate of FIG. 2.

FIG. 4 shows the opposite side routing layer of the printed circuit board 10. This layer contains routing traces 30 that route the inner pads 24 to external plating bars (not shown) used to plate the vias 26 of the board.

Figure 5:
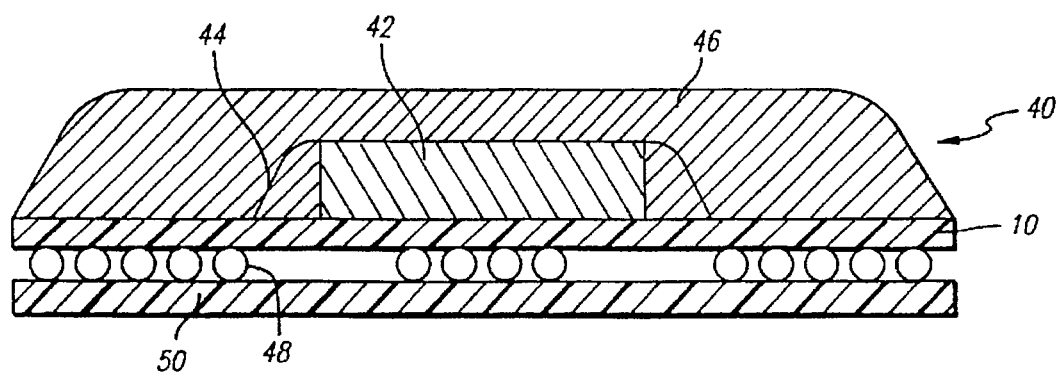
FIG. 5 is a cross-sectional view of a ball grid array integrated circuit package of the present invention.

FIG. 5 shows the substrate 10 incorporated into a ball grid array package 40. The package 40 contains an integrated circuit 42 that is mounted to the die paddle 12 of the board 10. The integrated circuit 42 is connected to the inner bond pads 24 and the bonding fingers 20 by wire bonds 44. The integrated circuit 42 may also be electrically connected to the die paddle 12 through ground pads located on the bottom surface of the IC. The integrated circuit 42 and wire bonds 44 are enclosed by an encapsulant 46.

Solder balls 48 are attached to the external solder pads 30 of the substrate 10. The package 40 can be attached to an external printed circuit board 50 by placing the solder balls 48 onto corresponding pads of the circuit board 50 and then reflowing the solder. The higher external pad density provided by the package of the present invention may reduce the footprint on the external circuit board 50 and reduce the size of the overall assembly.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A substrate for an integrated circuit package, comprising:

a substrate that has a first surface and an opposite second surface;

a center die paddle located on said first surface of said substrate; and, a plurality of bonding fingers located on said first surface of said substrate and arranged into a plurality of segments, each segment having a pattern that is shaped as a segment of a hyperbola.

2. The substrate as recited in claim 1, further comprising a plurality of external solder pads that are located on said second surface of said substrate and connected to said bonding fingers, said external solder pads being arranged in a rectangular matrix that has five rows.

3. The printed circuit board as recited in claim 2, wherein said external solder pads are connected to said bonding fingers by a plurality of vias.

4. The substrate as recited in claim 3, wherein a plurality of said vias are located between said center die paddle and said bonding fingers.

5. The substrate as recited in claim 1, wherein said center die paddle consists of a center portion and a pair of concentric outer rings.

6. The substrate as recited in claim 1, further comprising an inner bond pad located between said bonding fingers and said die paddle.

7. A ball grid array integrated circuit package, comprising:

a substrate that has a first surface and an opposite second surface;

a center die paddle located on said first surface of said substrate;

a plurality of bonding fingers located on said first surface of said substrate and arranged into a plurality of segments, each segment having a pattern that is shaped as a segment of a hyperbola;

a plurality of inner bond pads that are located on said first surface of said substrate and further located between said bonding fingers and said center die paddle;

a plurality of external solder pads located on said second surface of said substrate and connected to said center die paddle, said inner bond pads and said bonding fingers;

an integrated circuit die mounted to said center die paddle;

a plurality of wire bonds that connect said integrated circuit to said bonding fingers and said inner bond pads;

an encapsulant that encloses said integrated circuit die; and, a plurality solder balls attached to said external solder pads.

8. The package as recited in claim 7, wherein said external solder pads are connected to said bonding fingers and said inner bond pads by a plurality of vias.

9. The package as recited in claim 8, wherein a plurality of said vias are located between said bonding fingers and said inner bond pads.

10. The package as recited in claim 7, wherein said center die paddle consists of a center portion and a pair of concentric outer rings.

11. The package as recited in claim 7, wherein said external solder pads are arranged in a rectangular matrix that has five rows.

* * * * *

UNITED STATES PATENT AND TRADEMARK OFFICE
CERTIFICATE OF CORRECTION

PATENT NO. : 5,650,660
DATED : July 22, 1997
INVENTOR(S) : Michael Barrow It is certified that error appears in the above-identified patent and that said Letters Patent is hereby corrected as shown below:

In the Title Page at [73] insert --Assignee: Intel Corporation, Santa Clara, California--

Signed and Sealed this

Twenty-first Day of April, 1998

Attest:

BRUCE LEHMAN

Attesting Officer

Commissioner of Patents and Trademarks